(12) United States Patent
Shimonishi et al.

(10) Patent No.: US 9,741,698 B2
(45) Date of Patent: Aug. 22, 2017

(54) LIGHT-EMITTING DEVICE

(71) Applicant: TOYODA GOSEI CO., LTD., Kiyosu-shi (JP)

(72) Inventors: Shota Shimonishi, Kiyosu (JP); Kazuhiro Sakai, Kiyosu (JP); Shigeo Takeda, Kiyosu (JP); Tomohiro Miwa, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 5 days.

(21) Appl. No.: 14/723,311

(22) Filed: May 27, 2015

(65) Prior Publication Data
US 2015/0357535 A1 Dec. 10, 2015

(30) Foreign Application Priority Data
Jun. 10, 2014 (JP) ................................. 2014-119622

(51) Int. Cl.
| H01L 33/54 | (2010.01) |
| H01L 33/50 | (2010.01) |
| H01L 27/15 | (2006.01) |
| H01L 25/075 | (2006.01) |

(52) U.S. Cl.
CPC .......... *H01L 25/0753* (2013.01); *H01L 33/50* (2013.01); *H01L 2924/0002* (2013.01)

(58) Field of Classification Search
CPC .................................................... H01L 33/54
See application file for complete search history.

(56) References Cited

U.S. PATENT DOCUMENTS

| 2009/0167149 A1* | 7/2009 | Ito ........................ A61B 1/0638 |
| | | 313/501 |
| 2011/0050071 A1* | 3/2011 | Chung ...................... F21K 9/00 |
| | | 313/46 |
| 2012/0061702 A1* | 3/2012 | Andrews ................. H01L 33/54 |
| | | 257/98 |

(Continued)

FOREIGN PATENT DOCUMENTS

| JP | 2008-235458 A | 10/2008 |
| JP | 2012-079817 A | 4/2012 |

(Continued)

OTHER PUBLICATIONS

J. W. Diggle, Thomas C. Downie, and C. W. Goulding; Chem. Rev. 69(3), p. 365-405; 1969.*

(Continued)

*Primary Examiner* — Su C Kim
*Assistant Examiner* — David S Wilbert
(74) *Attorney, Agent, or Firm* — McGinn IP Law Group, PLLC

(57) ABSTRACT

A light-emitting device includes a substrate, a first light-emitting element mounted on the substrate, an annular transparent dam formed on the substrate so as to surround the first light-emitting element, a second light-emitting element that is mounted on the substrate so as to be embedded in an interior of the dam and that has a shorter peak emission wavelength than that of the first light-emitting element, and a sealing material filled inside the dam so as to seal the first light-emitting element.

20 Claims, 1 Drawing Sheet

(56) References Cited

U.S. PATENT DOCUMENTS

| | | | |
|---|---|---|---|
| 2012/0097997 A1* | 4/2012 | Chung | F21K 9/00 |
| | | | 257/89 |
| 2013/0077299 A1* | 3/2013 | Hussell | F21K 9/50 |
| | | | 362/231 |
| 2013/0341657 A1 | 12/2013 | Oyaizu | |
| 2014/0104850 A1* | 4/2014 | Yamamoto | H01L 33/60 |
| | | | 362/311.02 |

FOREIGN PATENT DOCUMENTS

| | | |
|---|---|---|
| JP | 2013-051375 A | 3/2013 |
| JP | 2014-007342 A | 1/2014 |
| JP | 2014-086694 A | 5/2014 |

OTHER PUBLICATIONS

Japanese Notification of Reasons for Refusal, dated Jun. 20, 2017, in Japanese Application No. 2014-119622 and English Translation thereof.

* cited by examiner

LIGHT-EMITTING DEVICE

The present application is based on Japanese patent application No. 2014-119622 filed on Jun. 10, 2014, the entire contents of which are incorporated herein by reference.

BACKGROUND OF THE INVENTION

1. Field of the Invention

The invention relates to a light-emitting device.

2. Description of the Related Art

A light-emitting device is known which has an annular frame, an annular transparent wall formed inside the frame, red LEDs which are mounted inside or embedded in the transparent wall, and blue LEDs mounted in a region inside the frame and outside the transparent wall (see e.g. JP-A-2013-51375).

The light-emitting device of JP-A-2013-51375 is constructed such that owing to the transparent wall, a sealing material filled in the region inside the frame and outside the transparent wall is separated from a sealing material filled inside the transparent wall and these two sealing materials are not mixed with each other. This construction allows only one sealing material to contain a phosphor, or two sealing materials to contain different types of phosphors.

SUMMARY OF THE INVENTION

It is an object of the invention to provide a light-emitting device that includes plural types of light-emitting elements emitting different colors, achieves high light extraction efficiency and has a light source portion with a small diameter.

(1) According to one embodiment of the invention, a light-emitting device comprises:

a substrate;

a first light-emitting element mounted on the substrate;

an annular transparent dam formed on the substrate so as to surround the first light-emitting element;

a second light-emitting element that is mounted on the substrate so as to be embedded in an interior of the dam and that has a shorter peak emission wavelength than that of the first light-emitting element; and a sealing material filled inside the dam so as to seal the first light-emitting element.

In the above embodiment (1) of the invention, the following modifications and changes can be made.

(i) The second light-emitting element emits a violet light.

(ii) The dam does not include a phosphor.

(iii) The sealing material includes a phosphor, and wherein the peak emission wavelength of the second light-emitting element is outside a wavelength range of an absorption spectrum of the phosphor included in the sealing material.

(iv) The dam comprises a filler.

Effects of the Invention

According to one embodiment of the invention, a light-emitting device can be provided that includes plural types of light-emitting elements emitting different colors, achieves high light extraction efficiency and has a light source portion with a small diameter.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Embodiment

Figure 1:
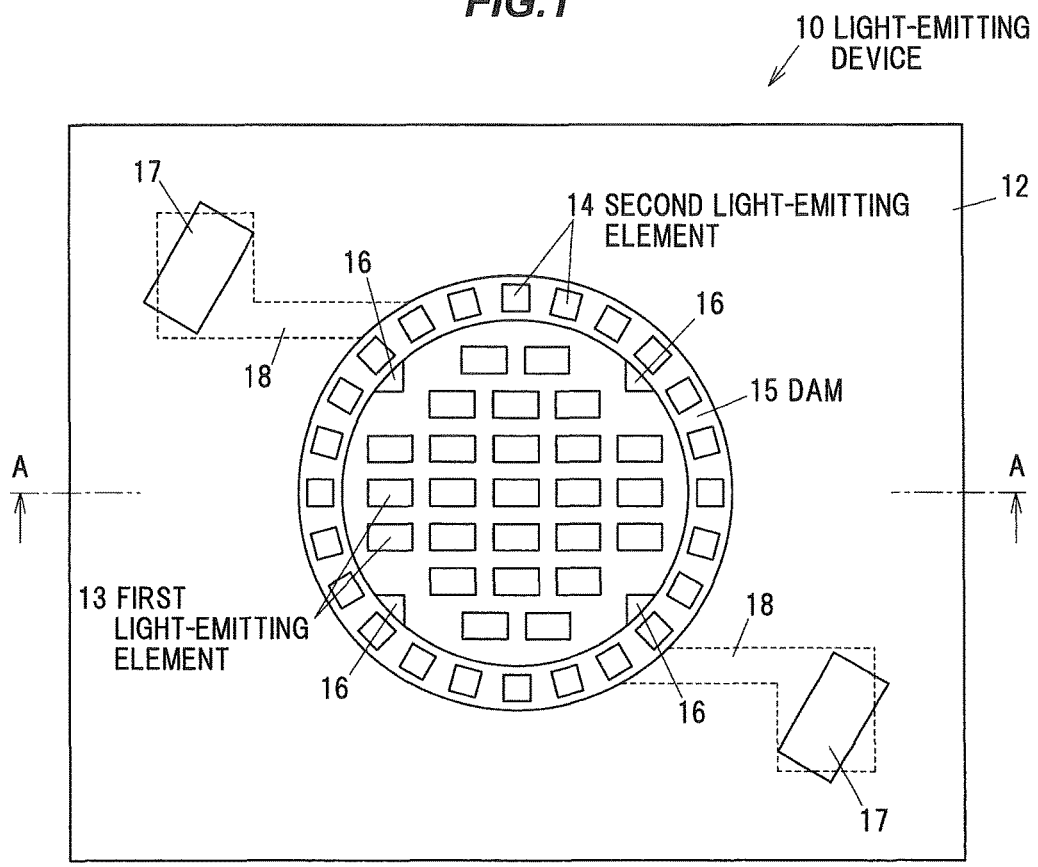
FIG. 1 is a top view showing a light-emitting device in an embodiment.
Figure 2:
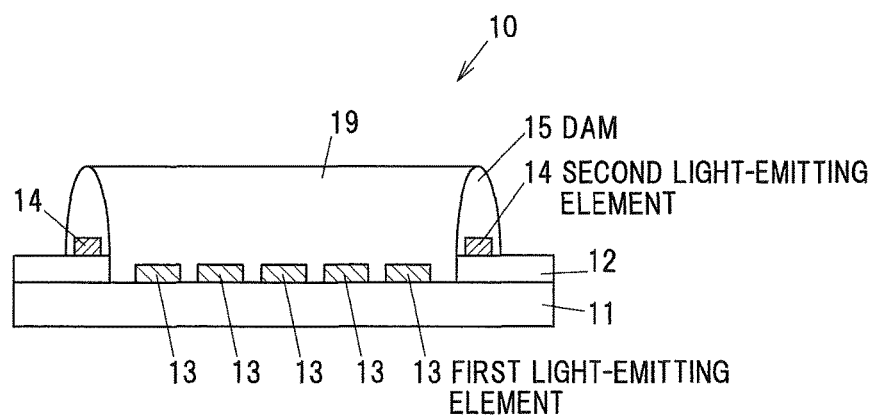
FIG. 2 is a vertical cross-sectional view showing the light-emitting device taken along a chain line A-A in FIG. 1.

FIG. 1 is a top view showing a light-emitting device 10 in the embodiment. FIG. 2 is a vertical cross-sectional view showing the light-emitting device 10 taken along a chain line A-A in FIG. 1.

The light-emitting device 10 has a substrate 11, first light-emitting elements 13 mounted on the substrate 11, an annular transparent dam 15 formed on the substrate 11 so as to surround the first light-emitting elements 13, second light-emitting elements 14 which are mounted on the substrate so as to be embedded in the dam 15 and have a shorter peak emission wavelength than that of the first light-emitting elements 13, and a sealing material 19 filled inside the dam 15 to seal the first light-emitting elements 13.

The light-emitting device 10 is a chip-on-board (COB) light-emitting device in which the first light-emitting elements 13 and the second light-emitting elements 14 are mounted on the substrate 11 having wiring.

The substrate 11 is, e.g., an aluminum substrate having an aluminum anodic oxide film on the surface thereof. The upper surface of the substrate 11 excluding a region inside the dam 15 is covered with an insulation layer 12. The insulation layer 12 is formed of an insulating material such as glass epoxy or polyimide.

The substrate 11 has wire bonding terminals 16 exposed inside the dam 15 and external connecting terminals 17 formed outside the dam 15. The wire bonding terminals 16 and the external connecting terminals 17 are connected through wiring electrodes 18 arranged under the insulation layer 12. An external power supply is connected to the external connecting terminals 17.

The first light-emitting elements 13 and the second light-emitting elements 14 are LEDs (Light Emitting Diodes) or laser diodes and are connected to each other by bonding wires (not shown). Then, elements located at ends of the wire bonding connection are connected to the wire bonding terminals 16 through bonding wires.

The layout of the first light-emitting elements 13 and the second light-emitting elements 14 and the wiring pattern of the bonding wires are not limited. For example, the group of the first light-emitting elements 13 and the group of the second light-emitting elements 14 may be connected in series or in parallel.

As described above, the second light-emitting element 14 has a shorter peak emission wavelength than that of the first light-emitting element 13. The following Table 1 shows examples of combinations of emission color of light-emitting elements 13 and emission color of the second light-emitting elements 14. "Blue+green+red", "blue+green+yellow+red", "blue+yellow+red", "blue+yellow", "green+red" and "yellow+red" mean that plural types of light-emitting elements emitting different colors are used as the first light-emitting elements 13.

TABLE 1

| | First light-emitting element | Second light-emitting element |
|---|---|---|
| 1 | Blue | Violet |
| 2 | Green | Violet |
| 3 | Red | Violet |
| 4 | Yellow | Violet |
| 5 | Green | Blue |
| 6 | Red | Blue |
| 7 | Yellow | Blue |
| 8 | Red | Green |
| 9 | Yellow | Green |
| 10 | Blue + Green + Red | Violet |
| 11 | Blue + Green + Yellow + Red | Violet |
| 12 | Blue + Yellow + Red | Violet |
| 13 | Blue + Yellow | Violet |
| 14 | Green + Red | Blue |
| 15 | Yellow + Red | Blue |

The emission wavelength of the second light-emitting element 14 is shorter than that of the first light-emitting element 13. Therefore, if the second light-emitting elements 14 are mounted inside the dam 15 (i.e., in an inner region surrounded by the dam 15) in the same manner as the first light-emitting elements 13, light emitted from the second light-emitting elements 14 is likely to attenuate due to absorption by the first light-emitting elements 13. In addition, when the sealing material 19 contains a phosphor, the light is absorbed also by the phosphor and is more likely to attenuate.

In the light-emitting device 10 of the present embodiment, the second light-emitting elements 14 are embedded in the interior of the dam 15. Therefore, attenuation of the light emitted from the second light-emitting elements 14 due to absorption by the first light-emitting elements 13 and by the phosphor in the sealing material 19 is small.

When, for example, the second light-emitting elements 14 in the light-emitting device 10 producing white light emit violet light (wavelength of, e.g., 380 to 420 nm), violet color improves color rendering properties of the light emitted from the light-emitting device 10, thereby showing white objects such as shirts more clearly. The violet light has a short wavelength but attenuation thereof is reduced in the light-emitting device 10 as described above.

As such, in order to highly efficiently emit white light with high color rendering properties, it is preferable that a white emission region is formed inside the annular dam 15 (i.e., in an inner region surrounded by the dam 15) and a violet emission region is formed in the interior of the annular dam 15. In forming the white emission region inside the annular dam 15, plural types of light-emitting elements in combination of producing white light (e.g., blue light-emitting elements and yellow light-emitting elements) may be used as the first light-emitting elements 13, or, a combination of the first light-emitting elements 13 with the phosphor in the sealing material 19 to produce white light (e.g., blue light-emitting elements and yellow phosphor) is selected. In forming the violet emission region in the interior of the annular dam 15, violet light-emitting elements may be used as the first light-emitting elements 13.

The dam 15 is formed of a transparent resin, e.g., a silicone-based resin or an epoxy-based resin, etc. The dam 15 does not contain white pigment such as titanium oxide and is transparent. In addition, it is preferable that the dam 15 do not contain any phosphor to prevent light emitted from the second light-emitting elements 14 from being absorbed by the phosphor.

The dam 15 preferably contains a filler to increase thixotropy. Deformation of the dam 15 before curing is prevented by adding the filler to the dam 15.

The sealing material 19 is formed of, e.g., a transparent resin such as silicone-based resin or epoxy-based resin. The sealing material 19 may additionally contain a filler formed of $SiO_2$, etc., for scattering light, or phosphor particles.

When the sealing material 19 contains a phosphor, the peak emission wavelength of the second light-emitting element 14 is preferably outside the wavelength range of the absorption spectrum of the phosphor. As a result, it is possible to prevent the light emitted from the second light-emitting elements 14 from being absorbed by the phosphor. Since the phosphor contained in the sealing material 19 produces fluorescent light, it is obvious that at least some of the first light-emitting elements 13 have a peak emission wavelength within the wavelength range of the absorption spectrum of the phosphor.

When, for example, the emission color of the first light-emitting elements 13 is blue and that of the second light-emitting elements 14 is violet, it is possible to use a YAG phosphor as the phosphor in the sealing material 19. Depending on the type of dopant, the YAG phosphor can have an absorption spectrum such that blue light is absorbed and violet light is not absorbed. In this case, the light-emitting device 10 can emit white light with high efficiency.

Effects of the Embodiment

In the light-emitting device 10 of the embodiment, the second light-emitting elements 14 having a short emission wavelength are mounted in a different area from the first light-emitting elements 13 having a long emission wavelength. Therefore, it is possible to reduce absorption of light from the second light-emitting elements 14 by the first light-emitting elements 13 and by the phosphor in the sealing material 19, thereby improving light extraction efficiency.

In addition, it is possible to reduce a diameter of a light source portion of the light-emitting device 10 since the second light-emitting elements 14 are embedded in the interior of the annular dam 15 which surrounds the first light-emitting elements 13 mounted on the substrate 11.

Although the embodiment of the invention has been described above, the invention is not intended to be limited to the embodiment and the various kinds of modifications can be implemented without departing from the gist of the invention.

In addition, the invention according to claims is not to be limited to the above-mentioned embodiment. Further, all combinations of the features described in the embodiment are not needed for solving the problem of the invention.

What is claimed is:

1. A light-emitting device, comprising:
   a substrate;
   a first light-emitting element in direct contact with a surface of the substrate;
   an annular transparent dam formed on the substrate so as to surround the first light-emitting element;
   an insulation layer in direct contact with the surface of the substrate;
   a second light-emitting element that is mounted on the substrate so as to be embedded in an interior of the dam and that has a shorter peak emission wavelength than that of the first light-emitting element, the second light-emitting element in direct contact with a top surface of the insulation layer; and a sealing material filled inside the dam so as to seal the first light-emitting element.

2. The light-emitting device according to claim 1, wherein the second light-emitting element emits a violet light.

3. The light-emitting device according to claim 1, wherein the dam does not include a phosphor.

4. The light-emitting device according to claim 1, wherein the sealing material includes a phosphor, and
wherein the peak emission wavelength of the second light-emitting element is outside a wavelength range of an absorption spectrum of the phosphor included in the sealing material.

5. The light-emitting device according to claim 1, wherein the dam comprises a filler.

6. The light-emitting device according to claim 1, wherein the first light-emitting element is disposed on an upper surface of the substrate.

7. The light-emitting device according to claim 6, wherein the insulation layer is disposed on the upper surface of the substrate.

8. The light-emitting device according to claim 1, wherein the insulation layer comprises an insulating material including one of a glass epoxy and polyimide.

9. The light-emitting device according to claim 8, wherein the substrate comprises an aluminum substrate including an aluminum anodic oxide film on a surface thereof.

10. The light-emitting device according to claim 9, wherein the dam comprises one of a silicone-based resin and an epoxy-based resin.

11. The light-emitting device according to claim 10, wherein the sealing material comprises one of a silicone-based resin and an epoxy-based resin.

12. The light-emitting device according to claim 1, wherein the substrate includes wire bonding terminals exposed inside of the dam and external connecting terminals disposed outside of the dam.

13. The light-emitting device according to claim 12, wherein the wire bonding terminals and the external connecting terminals are connected through wiring electrodes arranged under the insulation layer.

14. The light-emitting device according to claim 13, further comprising an external power supply connected to the external connecting terminals.

15. The light-emitting device according to claim 1, wherein an upper surface of the substrate excluding a region inside of the dam is covered with the insulation layer.

16. A light-emitting device, comprising:
a substrate;
an insulation layer in direct contact with a surface of the substrate;
a first light-emitting element in direct contact with the surface of the substrate;
a transparent dam disposed on the surface of the substrate to surround the first light-emitting element;
a second light-emitting element in direct contact with a top surface of the insulation layer, the second light-emitting element being embedded in an interior of the dam and has a shorter peak emission wavelength than that of the first light-emitting element; and
a sealing material that seals the first light-emitting element.

17. The light-emitting device according to claim 16, wherein the substrate includes wire bonding terminals exposed inside of the dam and external connecting terminals disposed outside of the dam.

18. The light-emitting device according to claim 17, wherein the wire bonding terminals and the external connecting terminals are connected through wiring electrodes arranged under the insulation layer.

19. The light-emitting device according to claim 18, further comprising an external power supply connected to the external connecting terminals.

20. The light-emitting device according to claim 16, wherein the surface of the substrate excluding a region inside of the dam is covered with the insulation layer.

* * * * *